(12) United States Patent
Knoll (10) Patent No.: US 9,790,130 B2
(45) Date of Patent: Oct. 17, 2017

(54) METHOD OF JOINING METAL-CERAMIC SUBSTRATES TO METAL BODIES

(75) Inventor: Heiko Knoll, Marburg (DE)

(73) Assignee: IXYS Semiconductor GmbH, Lampertheim (DE)

( * ) Notice: Subject to any disclaimer, the term of this patent is extended or adjusted under 35 U.S.C. 154(b) by 816 days.

(21) Appl. No.: 13/482,685

(22) Filed: May 29, 2012

(65) Prior Publication Data

US 2012/0305281 A1   Dec. 6, 2012

(30) Foreign Application Priority Data

May 31, 2011   (DE) .......... 10 2011 103 746

(51) Int. Cl.
| | |
|---|---|
| *B23K 31/00* | (2006.01) |
| *C04B 37/02* | (2006.01) |
| *H01L 21/48* | (2006.01) |
| *H01L 23/14* | (2006.01) |
| *H01L 23/373* | (2006.01) |

(52) U.S. Cl.
CPC .......... *C04B 37/021* (2013.01); *C04B 37/026* (2013.01); *H01L 21/4846* (2013.01); *H01L 23/147* (2013.01); *H01L 23/3735* (2013.01); *C04B 2235/656* (2013.01); *C04B 2235/665* (2013.01); *C04B 2235/96* (2013.01); *C04B 2237/121* (2013.01); *C04B 2237/125* (2013.01); *C04B 2237/126* (2013.01); *C04B 2237/128* (2013.01); *C04B 2237/343* (2013.01); *C04B 2237/366* (2013.01); *C04B 2237/368* (2013.01); *C04B 2237/402* (2013.01); *C04B 2237/403* (2013.01); *C04B 2237/407* (2013.01); *C04B 2237/704* (2013.01); *C04B 2237/706* (2013.01); *C04B 2237/708* (2013.01); *C04B 2237/72* (2013.01); *C04B 2237/86* (2013.01);

(Continued)

(58) Field of Classification Search
CPC ................. B23K 2201/36; B23K 2201/40
USPC ........................... 228/122.1, 123.1
See application file for complete search history.

(56) References Cited

U.S. PATENT DOCUMENTS

| | | | |
|---|---|---|---|
| 3,994,430 A | * | 11/1976 | Cusano .......... B23K 1/19 228/122.1 |
| 5,965,193 A | | 10/1999 | Ning et al. |

(Continued)

FOREIGN PATENT DOCUMENTS

| | | |
|---|---|---|
| EP | 1450401 | 8/2004 |
| EP | 2006895 | 12/2008 |
| EP | 2214202 | 8/2010 |

OTHER PUBLICATIONS

Office Action from the German Patent and Trademark Office dated Jan. 27, 2017, in related German patent application 102011103746.6 (5 pages).

*Primary Examiner* — Devang R Patel
(74) *Attorney, Agent, or Firm* — Imperium Patent Works; Amir V. Adibi (57) ABSTRACT

A method of joining a metal-ceramic substrate having metallization on at least one side to a metal body by using metal alloy is disclosed. The metal body has a thickness of less than 1.0 mm and the metal alloy contains aluminum and has a liquidus temperature of greater than 450° C. The resulting metal-ceramic module provides a strong bond between the metal body and the ceramic substrate. The resulting module is useful as a circuit carrier in electronic appliances, with the metal body preferably functioning as a cooling body.

21 Claims, 2 Drawing Sheets

(52) U.S. Cl.
CPC ............... *H01L 2924/0002* (2013.01); *H01L 2924/09701* (2013.01)

(56) References Cited

U.S. PATENT DOCUMENTS

| | | | |
|---|---|---|---|
| 5,998,043 A | | 12/1999 | Sasaki et al. |
| 6,033,787 A | * | 3/2000 | Nagase et al. ............... 428/545 |
| 6,054,762 A | * | 4/2000 | Sakuraba et al. ............ 257/703 |
| 6,122,170 A | | 9/2000 | Hirose et al. |
| 6,309,737 B1 | * | 10/2001 | Hirashima ............ C04B 37/026 174/258 |
| 6,426,154 B1 | * | 7/2002 | Naba et al. .................. 428/620 |
| 6,938,333 B2 | | 9/2005 | Osanai et al. |
| 7,143,929 B2 | * | 12/2006 | Furukuwa .................... 228/246 |
| 7,255,931 B2 | * | 8/2007 | Osanai et al. ................ 428/650 |
| 7,348,493 B2 | * | 3/2008 | Osanai et al. ................ 174/256 |
| 7,393,596 B2 | * | 7/2008 | Osanai et al. ................ 428/650 |
| 7,482,685 B2 | * | 1/2009 | Fukuda et al. ................ 257/703 |
| 7,532,481 B2 | * | 5/2009 | Nagase et al. ............... 361/739 |
| 8,377,240 B2 | * | 2/2013 | Schulz-Harder ........ B32B 18/00 156/89.11 |
| 2010/0068552 A1 | | 3/2010 | Goerlich et al. |
| 2010/0219228 A1 | * | 9/2010 | Yamashita et al. ............ 228/19 |

\* cited by examiner

METHOD OF JOINING METAL-CERAMIC SUBSTRATES TO METAL BODIES

BACKGROUND OF THE INVENTION

The invention relates to a method of joining metal-ceramic substrates to metal bodies. The resulting metal-ceramic modules can be used, in particular, in the field of power semiconductor modules as circuit carriers. These circuit carriers are typically a ceramic provided on the upper side and underside with metallization, e.g. aluminum or copper, for example an oxide ceramic in which at least one metallized side has a circuit structure. The metal bodies to be joined to the ceramic substrate serve, in particular, to conduct the heat evolved in the power-electronic component during operation on or away.

Prior art for fastening ceramic substrates to metal bodies utilized for removal of heat, for example in the case of module baseplates, is adhesive bonding of the components, e.g. by soft soldering using SnPb, SnAg, SnAgCu or comparable suitable solder materials. Such a method is described, for example, in the Patent Application US 2010068552 A1. The metal bodies used typically have a thickness in the range from 3 mm to 10 mm.

Adhesive bonding of ceramic substrates and baseplates, which typically comprise copper (Cu), by means of soft solder with cyclic thermal stressing of the power modules, however, leads to formation of cracks and delamination in the solder layer, which can reduce heat transfer and lead to failure of the component. The number of mechanical loading cycles until crack formation, for example due to cyclic thermal stresses during use, is dependent not only on the mechanical properties of the ceramic substrate, the baseplate and the solder material, e.g. the coefficient of thermal expansion and the E modulus, but also on the effective temperature change, the solder thickness and the lateral substrate size.

The use of hard solder materials for joining ceramic substrates to metal bodies is known. For example, the Patent Application EP 0 827 198 A1 describes a method of joining a ceramic substrate to a copper plate using a hard solder material containing an active metal such as titanium, chromium or hafnium. The individual parts are pressed and heated at 850° C. or 1063° C. in a vacuum furnace to form the bond.

The Patent Application EP 0 788 153 A2 discloses a method of joining a ceramic substrate to a metal layer using a solder which has a melting point of not more than 1000° C. and consists essentially of nickel, copper and/or iron. For example, the use of NiP, which is firstly joined at 600° C. to the ceramic substrate and subsequently joined at 970° C. to the metal layer, is mentioned. The thickness of the resulting bonding layer of solder is said to be from 2 μm to 40 μm.

The Patent Application EP 0 969 511 A2 also relates to a method of joining a ceramic substrate to a metal layer, in which a solder which has a melting point of not more than 1000° C. and consists essentially of nickel, copper and/or iron is used. For example, the use of NiP, which is firstly joined at 600° C. to the ceramic substrate and subsequently joined at 970° C. to the metal layer, is mentioned.

This procedure, however, is not suitable for fastening ceramic substrates which have metallization on at least one side to metal bodies utilized for removal of heat since cyclic thermal stress of the power modules leads to formation of cracks and delaminations which can firstly reduce heat transfer and also lead to failure of the component. Furthermore, this procedure is, particularly as a result of the comparatively high temperatures, complicated and costly.

Apart from the soldering methods, direct bonding methods, e.g. direct copper bonding (DCB), direct aluminum bonding (DAB) and active metal brazing (AMB), in which the metal is melted at high temperatures and the resulting melt is applied to the ceramic substrate and subsequently solidified, are also known. Such methods are disclosed, for example, in the Patent Applications EP 0 676 800 A2, EP 1 187 198 A2 and EP 2 214 202 A2, which describe methods of producing aluminum-metallized ceramic substrates and also of joining such substrates to baseplates composed of aluminum or aluminum alloys.

Furthermore, the Patent Application EP 1 187 198 A2 compares, in the experimental part, the above-described procedure with a method in which an aluminum nitride ceramic substrate is firstly printed with solder containing 87.5% by weight of Al and 12.5% by weight of Si and a rolled aluminum sheet is subsequently arranged on the ceramic substrate, the assembly is heated to 575° C. in a vacuum furnace and is then nickel plated by an electroless method (see EP 1 187 198 A2: Comparative Example 1).

The methods of these documents in the form in which they are disclosed are, however, in particular because of the single part processing and as a result of the comparatively high temperatures, extremely complicated and costly. The restriction of the thickness and the yield stress of the baseplates used, as described in EP 2 214 202 A2, also results in a limitation of the possible fields of application. Reasons for the limitation of the yield stress are thus the mechanical stresses arising in the system when subjected to heat, which are reduced by the proposed low yield stress values to values which can be withstood by the ceramic substrate.

Finally, the recent literature has proposed sintering or diffusion bonding for the adhesive bonding of ceramic substrates to metal bodies. The low-temperature sintering technology, which has in recent years been successfully used, in particular, for the die-attach method, however, has only limited suitability for joining ceramic substrates to metal bodies since in this process pressures in the range from 2 MPa to 20 MPa have to be employed for producing the sintered join. In the case of a typical substrate size of 30×40 $mm^2$, a force of 2.4 kN has to be applied for a joining pressure of 2 MPa (e.g. in the case of nanosilver technology).

The metal bodies, in particular the baseplates, of the metal-ceramic modules, in particular the power-electronic components, are frequently fastened by suitable methods, e.g. screwing or clamping, to the cooling bodies required for removal of heat. Since heat transfer between metal body and cooling surface, in particular between module baseplate and cooling surface, can occur only in locally limited small regions due to the surface roughness and/or surface corrugation, coupling media, known as thermal interface materials (TIM), which fill out the unevennesses in the interface between metal body and cooling surface, in particular between module baseplate and cooling surface, and thus ensure better heat transfer are used for assembly.

The TIM required in the mounting of the module bottom on the cooler increases the thermal resistance of the total system since the TIMs available at present have a thermal conductivity only in the range from 0.5 to a maximum of 10 K/W*m.

A further possible way of achieving improved cooling of power-electronic components is direct contact of the cooling medium with the underside of the ceramic substrate, with the ceramic substrates being fixed in a suitable shaped body and the entry of cooling medium into the component being prevented by appropriately designed seals (e.g. Danfoss ShowerPower®).

Direct cooling of the ceramic substrates by means of the cooling medium in the module construction (e.g. Danfoss ShowerPower®), however, is limited by the maximum possible pressure of the cooling medium due to the risk of intrusion of cooling medium into the component increases with increasing pressure. Furthermore, the substrate undersides which are in direct contact with the cooling medium can be enlarged only to a limited extent in terms of their surface area, so that in this case there is no optimized contact between ceramic substrate and cooling medium, which in turn has an adverse effect on heat transfer.

Finally, it is also known that high-quality metal-ceramic modules can be obtained by use of materials which are better matched to the coefficients of thermal expansion of the ceramic substrates, e.g. AlSiC, MoCu, WCu, CuMoCu or Cu/Invar/Cu. This likewise requires one of the known joining technologies for joining ceramic substrate and bottom, e.g. soldering or sintering, with the above-described disadvantages and also can be implemented only for modules having very demanding requirements in terms of reliability, e.g. spaceflight, because of the high costs of material for the baseplates.

BRIEF SUMMARY OF THE INVENTION

The present invention provides better ways of joining metal-ceramic substrates to metal bodies. In particular, better ways of bonding metal bodies to ceramic substrates having metallization on at least one side, in particular for stronger and more stable bonding of metal cooling bodies to ceramic substrates having metallization on at least one side, so that the join preferably also withstands cyclic thermal stress very well, were sought. The formation of cracks and delamination at the join under such cyclic thermal stresses should be avoided to the best possible extent to ensure better long-term properties, in particular better long-term heat transfer, of the metal-ceramic module and to minimize the risk of failure of the metal-ceramic module during use. The use of further joining means, in particular screws, clamps or other coupling media such as thermal interface materials (TIM) should also be avoided if possible. At the same time, the solution according to the invention should be able to be realized very inexpensively and efficiently in a preferably simple way.

These and further aspects of the invention are described below and are achieved by a method of producing a metal-ceramic module having all the features of claim 1. The dependent claims referring back to claim 1 describe preferred variants of the method of the invention. Furthermore, the metal-ceramic module according to the invention and particularly advantageous fields of use of the metal-ceramic module according to the invention are protected.

Herein a method of joining a metal-ceramic substrate to a metal body by means of a metal alloy, where the metal-ceramic substrate has metallization on at least one side, is described. In the process a metal body having a thickness of less than 1 mm is used. A metal alloy which contains aluminum and has a liquidus temperature of greater than 450° C. is arranged between the metal-ceramic substrate and the metal body. The resulting assembly is heated to a temperature of greater than 450° C. Surprisingly this approach makes it possible to provide metal-ceramic modules having a better property profile. The method of the invention allows bonding of metal bodies to ceramic substrates and in particular makes it possible to achieve stronger and more stable bonding of metal bodies to ceramic substrates, with the join also withstanding cyclic thermal stress very well. The formation of cracks and delamination at the join in the case of such cyclic thermal stresses is avoided and better long-term properties, in particular a better long-term heat transfer, of the metal-ceramic modules are thus ensured and the risk of failure of the metal-ceramic module during use is comparatively low. As a result using metal bodies of less than 1 mm thick, only small mechanical stresses which are not critical for the metal-ceramic substrate are generated in the case of thermal stressing of the composite of metal-ceramic substrate and metal body. Thus limitation of the yield stress of the metal bodies to be used is not necessary. The use of further joining means, in particular screws, clamps or other coupling media such as thermal interface materials (TIM) is not required for the purposes of the present invention. Furthermore, the solution according to the invention can be realized inexpensively and efficiently in a comparatively simple way.

DETAILED DESCRIPTION OF THE INVENTION

The present invention provides a method of joining a metal-ceramic substrate to a metal body by means of a metal alloy, in which a metal alloy is firstly arranged between the metal-ceramic substrate and the metal body. The metal-ceramic substrate to be used according to the invention comprises a ceramic substrate and metallization on at least one side.

The ceramic substrate is preferably an inorganic, nonmetallic substrate, in particular a clay mineral. Preferred ceramic substrates encompass oxides and nitrides, especially aluminum oxide, aluminum nitride and silicon nitride, in particular aluminum oxide. For the purposes of the present invention, the ceramic substrate comprises metallization, preferably composed of aluminum or copper, in particular aluminum, on at least one surface.

The electrical conductivity of the metallization is advantageously greater than $10^2$ $(\Omega \cdot cm)^{-1}$, preferably greater than $10^3$ $(\Omega \cdot cm)^{-1}$, particularly preferably greater than $10^4$ $(\Omega \cdot cm)^{-1}$, in particular greater than $10^5$ $(\Omega \cdot cm)^{-1}$. In the context of the present patent application, all values indicated relate to a temperature of 25° C., unless indicated otherwise.

The thickness of the metallization is preferably greater than 50.0 µm, more preferably greater than 75.0 µm, particularly preferably greater than 100.0 µm, very particularly preferably greater than 150.0 µm, in particular greater than 200.0 µm. Furthermore, the thickness of the metallization is advantageously less than 1000.0 µm, preferably less than 750.0 µm, particularly preferably less than 500.0 µm, in particular less than 400.0 µm.

The metallization is preferably applied to the surface of the ceramic substrate by a direct bonding method. Such methods include, in particular, direct copper bonding (DCB), direct aluminum bonding (DAB) and active metal brazing (AMB), in which the metal is melted at high temperatures and the resulting melt is applied to the ceramic substrate and subsequently solidified. Such methods are described, for example, in the Patent Applications EP 0 676 800 A2 and EP 1 187 198 A2.

In a first preferred embodiment of the present invention, the ceramic substrate has metallization on its upper side and its underside. The metal body is joined via one of these sides, preferably the underside, to the ceramic substrate.

In another embodiment of the present invention, the ceramic substrate has metallization only on its upper side and the metal body is joined via the underside of the ceramic substrate to the latter.

It is advantageous for at least one metallized side to have a circuit structure. The metal body to be used according to the invention is preferably a metal sheet.

According to the invention, the thickness of the metal body is less than 1.0 mm, preferably less than 0.9 mm, particularly preferably less than 0.8 mm, very particularly preferably less than 0.7 mm, in particular less than 0.6 mm. Furthermore, the thickness of the metal body is preferably greater than 0.05 mm, more particularly preferably greater than 0.1 mm, very particularly preferably greater than 0.2 mm, in particular greater than 0.3 mm. The thickness of the metal body is preferably determined perpendicular to the join.

Otherwise, the metal body to be joined to the metal-ceramic substrate is in principle not subject to any particular restrictions. However, it preferably serves to conduct the heat evolved in the power-electronic component during operation on or away. For this reason, the side of the metal-ceramic substrate facing the metal body is preferably smaller than the side of the metal body facing the metal-ceramic substrate to ensure a particularly efficient cooling action.

For the purposes of the invention, the metal body preferably has the following materials properties:
1. High electrical conductivity,
2. High thermal conductivity,
3. Ductility (deformability) and
4. Metallic shine (mirror shine).

Preferred metal bodies are made of chemical elements located in the Periodic Table of the Elements on the left of and below a dividing line from boron to astatine. Metal bodies which are very particularly advantageous for the purposes of the present invention are aluminum and copper, in particular aluminum. Furthermore, metal bodies comprising AlSiC, MoCu, WCu, CuMoCu and/or Cu/Invar/Cu have been found to be advantageous for high-power applications.

The metal alloy is a material composed of two or more alloy elements which interact metallurgically with one another. Accordingly, the alloy comprises aluminum and a further alloy element, preferably an element of main group II or IV of the Periodic Table of the Elements, advantageously magnesium (Mg) or silicon (Si), in particular silicon.

The aluminum content of the alloy is, according to the invention, greater than 0.0% by weight and less than 100.0% by weight, preferably greater than 50.0% by weight, particularly preferably greater than 70.0% by weight, advantageously greater than 75.0% by weight, more advantageously greater than 80.0% by weight, in particular greater than 85.0% by weight, in each case based on the total weight of the alloy.

In a particularly preferred variant of the present invention, the alloy contains silicon as further alloy element. The silicon content of the alloy is preferably greater than 0.1% by weight, more preferably greater than 4.0% by weight, particularly preferably greater than 5.0% by weight, advantageously greater than 7.5% by weight, more preferably greater than 10.0% by weight, in particular greater than 11.5% by weight, in each case based on the total weight of the alloy.

Furthermore, the silicon content of the alloy is preferably less than 30.0% by weight, more preferably less than 25.0% by weight, particularly preferably less than 20.0% by weight, advantageously less than 15.0% by weight, more advantageously less than 13.5% by weight, in particular less than 12.5% by weight, in each case based on the total weight of the alloy.

Very particularly advantageous results are obtained when using an alloy composed of 88.0% by weight of aluminum and 12.0% by weight of silicon, in each case based on the total weight of the alloy.

In addition, the use of alloys which are composed of aluminum, from 4.0% by weight to 12.0% by weight of silicon and, apart from production-related impurities of not more than 0.1% by weight, also at least two additional alloy components selected from among
a) from 0.5% by weight to 32.0% by weight of copper,
b) from 0.5% by weight to 8.0% by weight of tin,
c) from 0.2% by weight to 2.0% by weight of magnesium,
d) from 0.2% by weight to 8.0% by weight of silver, in each case based on the total weight of the alloy,
where all alloy components add up to 100.0% by weight, is also advantageous. The impurity elements present in the alloy, for example iron and magnesium, should advantageously in each case not exceed 0.05% by weight, based on the total weight of the alloy.

In a particularly preferred embodiment of the invention, the additional alloy components are selected from among
a-1) from 23.0% by weight to 32.0% by weight of copper and
d-1) from 0.1% by weight to 8.0% by weight of silver, in each case based on the total weight of the alloy.

In another preferred 4-component alloy, the further alloy components are selected from among
a-2) from 0.5% by weight to 8.0% by weight of copper and
d-2) from 0.1% by weight to 8.0% by weight of silver, in each case based on the total weight of the alloy.

In a further preferred alloy, the further alloy components are selected from among
a-3) from 0.5% by weight to 8.0% by weight of copper and
b-3) from 0.2% by weight to 8.0% by weight of tin and
c-3) from 0.2% by weight to 2.0% by weight of magnesium, in each case based on the total weight of the alloy.

Alloys in which the further alloy components are tin and magnesium in the following concentrations
b-4) from 0.5% by weight to 8.0% by weight of tin and
c-4) from 0.1% by weight to 2.0% by weight of magnesium, in each case based on the total weight of the alloy, are also particularly suitable.

Al—Si alloys composed of aluminum, from 4.0% by weight to 12.0% by weight of silicon and, apart from production-related impurities of not more than 0.1% by weight, also the following alloy components a-5) from 0.5% by weight to 8.0% by weight of copper and d-5) from 1.0% by weight to 8.0% by weight of silver, where the percentages are in each case based on the total weight of the alloy,
have been found to be particularly suitable, in particular for use for hard soldering of aluminum joins.

It has been found that the increased silver content of these alloys further reduces the melting point and improves the wetting of the parts to be joined.

A further group of Al—Si alloys which are very well suited for use for hard soldering of aluminum joins has been found to be Al—Si alloys which are composed of aluminum, from 4.0% by weight to 12% by weight of silicon and, apart from production-related impurities of not more than 0.1% by weight, also the following alloy components from 2.0% by weight to 8.0% by weight of copper, from 0.2% by weight to 3.0% by weight of tin, from 0.2% by weight to 2.0% by weight of magnesium, where the percentages are in each case based on the total weight of the alloy.

In a further particularly preferred variant of the present invention, the alloy contains magnesium as further alloy element. The magnesium content of the element is preferably greater than 0.1% by weight, more preferably greater than 0.5% by weight, particularly preferably greater than 1.0% by weight, advantageously greater than 1.5% by weight, more advantageously greater than 2.0% by weight, in particular greater than 2.5% by weight, in each case based on the total weight of the alloy. Furthermore, the magnesium content of the alloy is preferably less than 10.0% by weight, more preferably less than 9.0% by weight, particularly preferably less than 8.0% by weight, advantageously less than 7.0% by weight, more advantageously less than 6.0% by weight, in particular less than 5.5% by weight, in each case based on the total weight of the alloy.

The impurity elements present in the alloy, for example iron and manganese, should advantageously in each case not exceed 0.05% by weight, based on the total weight of the alloy.

For the purposes of the present invention, it is particularly advantageous for the ceramic substrate, the metal alloy and preferably also the metal body to have a great chemical similarity. For this reason, the ceramic substrate, the metal alloy and preferably also the metal body advantageously have at least one element in common whose proportion by weight in each component is advantageously greater than 25.0% by weight, preferably greater than 50.0% by weight, in each case based on the total weight of the component. The element in common is preferably aluminum.

The liquidus temperature of the metal alloy is, according to the invention, greater than 450° C., preferably greater than 500° C., particularly preferably greater than 550° C., in particular greater than 575° C. Furthermore, the liquidus temperature of the metal alloy is advantageously less than 650° C., preferably less than 625° C., particularly preferably less than 600° C., very particularly preferably less than 590° C., in particular less than 580° C.

For the purposes of the present invention, the liquidus temperature is the temperature above which the alloy is completely liquid.

The solidus temperature of the metal alloy is preferably greater than 450° C., more preferably greater than 500° C., particularly preferably greater than 550° C., in particular greater than 575° C. Furthermore, the solidus temperature is advantageously less than 650° C., preferably less than 625° C., particularly preferably less than 600° C., very particularly preferably less than 590° C., in particular less than 580° C.

For the purposes of the present invention, the solidus temperature is the temperature below which the alloy is completely solid.

Preferably the metal alloy thickness is greater than 50.0 μm, preferably greater than 75.0 μm, particularly preferably greater than 100.0 μm, very particularly preferably greater than 150.0 μm, in particular greater than 200.0 μm. Furthermore, the thickness of the metal alloy is advantageously less than 1000.0 μm, preferably less than 750.0 μm, particularly preferably less than 500.0 μm, in particular less than 250.0 μm.

The thickness of the ceramic substrate is not subject to any particular restrictions. However, the procedure according to the invention has been found to be particularly suitable for ceramic substrates having a thickness of less than 2000.0 μm, preferably less than 1500.0 μm, particularly preferably less than 750.0 μm, very particularly preferably less than 500.0 μm, in particular less than 400.0 μm. Furthermore, the thickness of the ceramic substrate is preferably greater than 50.0 μm, more preferably greater than 75.0 μm, particularly preferably greater than 100.0 μm, very particularly preferably greater than 200.0 μm, in particular greater than 300.0 μm.

The above values for the thicknesses of the metal alloy, the ceramic substrate, the metallization and the metal body are advantageously determined perpendicular to the contact surfaces ceramic substrate/metal alloy/metal body.

In the case of a nonuniform thickness of the metal alloy, the figure indicated relates to the smallest value (minimum thickness). In the case of curved surfaces, the thickness is in each case determined in the direction of the normal to the contact surfaces ceramic substrate/metal alloy/metal body and the figure indicated once again relates to the smallest value (minimum thickness).

The electrical conductivity of the ceramic substrate, the metal body and the metal alloy can in principle be chosen freely. However, the electrical conductivity of the metal body is advantageously greater than $10^2$ $(\Omega \cdot cm)^{-1}$, preferably greater than $10^3$ $(\Omega \cdot cm)^{-1}$, particularly preferably greater than $10^4$ $(\Omega \cdot cm)^{-1}$, in particular greater than $10^5$ $(\Omega \cdot cm)^{-1}$.

The electrical conductivity of the metal alloy is advantageously less than the electrical conductivity of the metal body. It is preferably less than $10^2$ $(\Omega \cdot cm)^{-1}$, preferably less than $10^1$ $(\Omega \cdot cm)^{-1}$, particularly preferably less than $10^0$ $(\Omega \cdot cm)^{-1}$, advantageously less than $10^{-1}$ $(\Omega \cdot cm)^{-1}$, very particularly preferably less than $10^{-2}$ $(\Omega \cdot cm)^{-1}$, in particular less than $10^{-3}$ $(\Omega \cdot cm)^{-1}$. Furthermore, the electrical conductivity of the metal alloy is preferably greater than $10^{-8}$ $(\Omega \cdot cm)^{-1}$, preferably greater than $10^{-7}$ $(\Omega \cdot cm)^{-1}$, particularly preferably greater than $10^{-6}$ $(\Omega \cdot cm)^{-1}$, in particular greater than $10^{-5}$ $(\Omega \cdot cm)^{-1}$.

The electrical conductivity of the ceramic substrate is advantageously less than the electrical conductivity of the metal alloy. It is preferably less than $10^{-6}$ $(\Omega \cdot cm)^{-1}$, more preferably less than $10^{-8}$ $(\Omega \cdot cm)^{-1}$, particularly preferably less than $10^{-10}$ $(\Omega \cdot cm)^{-1}$, advantageously less than $10^{-12}$ $(\Omega \cdot cm)^{-1}$, in particular less than $10^{-14}$ $(\Omega \cdot cm)^{-1}$.

The method of the invention makes it possible to join structured or unstructured metal-ceramic substrates, e.g. DAB substrates or DCB substrates, to metal bodies. These metal bodies are preferably composed of aluminum and can have the shape of cooling bodies as are typically used for removal of heat in electronic components.

To join the metal-ceramic substrate and the metal body, the assembly comprising the metal-ceramic substrate, the metal alloy and the metal body is heated to a temperature of greater than 450° C., preferably greater than 500° C., particularly preferably greater than 550° C., in particular greater than 575° C. Here, the assembly is preferably heated to a temperature of less than 900° C., more preferably less than 800° C., particularly preferably less than 700° C., in particular less than 650° C. After liquefaction of the alloy, this is preferably solidified again, advantageously by cooling the assembly comprising the metal-ceramic substrate, the metal alloy and the metal body to a temperature of less than 450° C., preferably less than 300° C., particularly preferably less than 200° C., even more preferably less than 100° C., in particular less than 50° C.

To join metal-ceramic substrate and metal body, the assembly comprising the metal-ceramic substrate, the metal alloy and the metal body is advantageously introduced into a furnace, e.g. a tunnel kiln, and preferably heated to a temperature above the melting point of the joining layer, but advantageously below the melting points of any ceramic substrate metallization present and of the metal body. The joining of ceramic substrate and metal body is advantageously carried out under an inert gas atmosphere. As a result of the melting of the joining layer, any ceramic substrate metallization and the metal body are advantageously wetted with the alloy and adhesively bonded after cooling by the diffusion processes which occur. A procedure which has been found to be very particularly useful is one in which the assembly comprising the metal-ceramic substrate, the metal alloy and the metal body is heated continuously from an initial temperature of less than 450° C., preferably less than 300° C., particularly preferably less than 200° C., even more preferably less than 100° C., in particular less than 50° C., to a temperature of greater than 450° C., preferably greater than 500° C., particularly preferably greater than 550° C., in particular greater than 575° C., and then cooled, once again continuously, to a temperature of less than 450° C., preferably less than 300° C., particularly preferably less than 200° C., even more preferably less than 100° C., in particular less than 50° C.

Alternative methods of joining the ceramic substrate and the metal body include plasma soldering, laser soldering, flame soldering and induction soldering. However, furnace soldering has been found to be very particularly useful for the purposes of the present invention.

The formation of the bond between metal-ceramic substrate and metal body is achieved by means of the layer of metal alloy which is introduced into this interface and preferably has a lower melting point than any substrate metallization present and the metal body and whose surfaces are wetted very well during the joining process. This layer can either be firmly bound to at least one of the join partners (metal-ceramic substrate and/or metal body) or be laid as a loose plate between the side of the metal-ceramic substrate to be bonded and the metal body.

The application of a plurality of structured metal-ceramic substrates which are restricted to an optimum in terms of their lateral dimension to a joint shaped metal body and production of suitable electric connections between these metal-ceramic substrates makes reliable overall circuits possible, even for relatively high powers.

Provision of the metal-ceramic substrates with the electrical components, e.g. semiconductor chips, thermistors, etc., and the production of the electric circuitry is preferably effected by suitable methods known to those skilled in the art after establishment of the bond between metal-ceramic substrate and metal body.

According to the present invention, the surface of the resulting metal-ceramic module is preferably at least partly coated with nickel, gold, silver and/or a layer system composed of these materials.

The metal-ceramic module which can be obtained according to the invention is in particular characterized by a very strong bond between the metal body and the ceramic substrate. The peeling force required for separating ceramic substrate and metal body is preferably greater than 3 N/mm.

Preferred fields of application of the metal-ceramic module which can be obtained according to the invention include its use as circuit carrier in electronic appliances, with the metal body of the metal-ceramic module preferably functioning as cooling body.

The invention is illustrated below by several examples, without this constituting a restriction of the inventive concept.

EXAMPLE 1

Joining of DAB Substrates Metallized on Both Sides and Structured on One Side to an Al—Si-Coated Aluminum Sheet In this example, DAB ceramic substrates having a lateral size of 36 mm×20 mm ($Al_2O_3$ ceramic (thickness 0.38 mm) with Al metallization (thickness 0.3 mm) on both sides, where the upper side of the DAB substrate is structured for a circuit) are joined to a 0.2 mm thick aluminum sheet coated on one side with Al—Si.

For the joining process, the substrates to be joined are placed with the unstructured side on the Al—Si-coated side of the aluminum sheet in defined positions.

Figure 1:
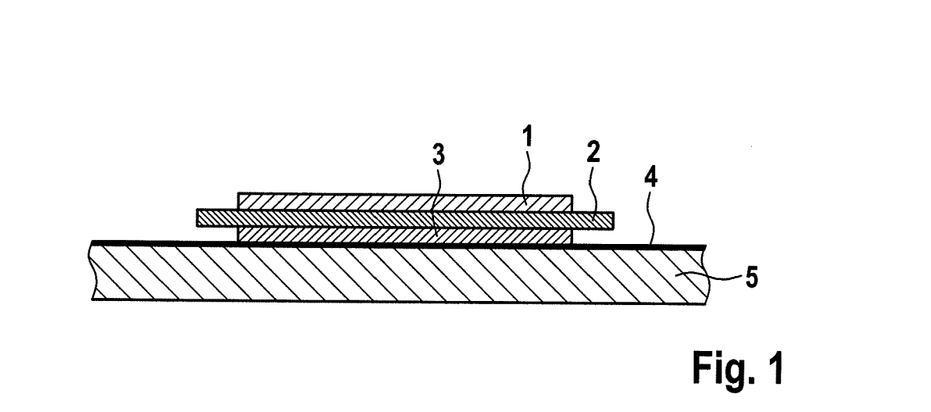
FIG. 1 illustrates a first example of a process for joining a metal ceramic substrate to a metal body.

An in-principle sketch through the cross section of the structure is shown in FIG. 1, where the metallized ceramic substrate comprises a ceramic 2 and metallization 1 and 3 on both sides and the joining layer 4 is firmly joined to the aluminum sheet 5.

This stack is placed on the conveyor belt of a tunnel kiln having a plurality of heating zones and is moved at a constant transport speed through the furnace and in the process heated to a temperature in the range from 580° C. to 650° C. After passing through the heating zones, the assembly is cooled to room temperature (25° C.). The furnace process is carried out under an $N_2$ atmosphere.

After the joining process, the ceramic substrate and the aluminum sheet are adhesively bonded to one another, with the peeling force for separating ceramic substrate and aluminum sheet being greater than 3 N/mm.

EXAMPLE 2

Joining of a Structured DAB Substrate to an Aluminum Sheet by Means of Loosely Laid Al—Si Plates In this example, a DAB ceramic substrate having a lateral size of 36 mm×20 mm ($Al_2O_3$ ceramic (thickness 0.38 mm) with Al metallization (thickness 0.3 mm) on both sides) is joined to a 0.8 mm thick Al sheet, with the upper metallization of the DAB substrate being structured for a circuit. Before the joining process, an Al—Si plate having a size of 36 mm×20 mm and a thickness of 0.075 mm for each substrate to be joined is placed in the defined positions on the upper side of the aluminum sheet and the unstructured underside of the ceramic substrate is positioned thereon.

Figure 2:
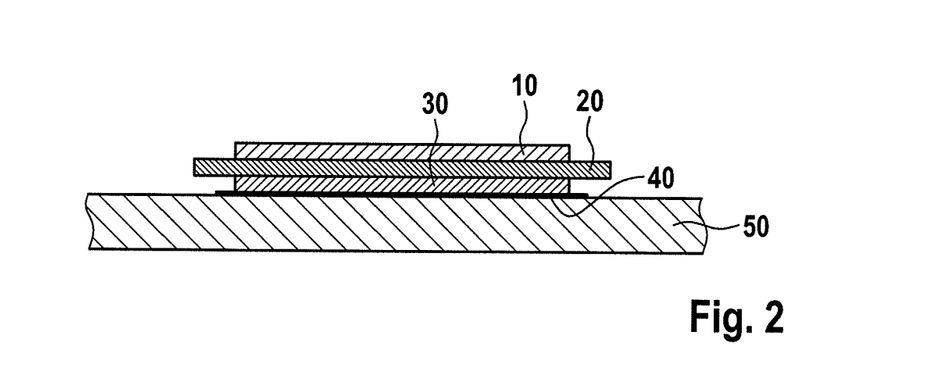
FIG. 2 illustrates a second example of a process for joining a metal ceramic substrate to a metal body.

An in-principle sketch through the cross section of the structure is shown in FIG. 2, where the metallized ceramic substrate comprises a ceramic 20 and metallization 10, 30 on both sides, the joining layer 40 is made up of plates and the aluminum sheet is denoted by the reference numeral 50.

This stack is placed on the conveyor belt of a tunnel kiln having a plurality of heating zones and heated at a constant transport speed to a temperature in the range from 580° C. to 650° C. and after passing through the heating zones is cooled again to room temperature. The furnace process is carried out here under an $N_2$ atmosphere.

After the joining process, the ceramic substrate and the aluminum sheet are adhesively bonded to one another.

EXAMPLE 3

Joining of DCB Substrates Metallized and Structured on One Side to an Al—Si-Coated Aluminum Sheet In this example, DCB ceramic substrates having a lateral size of 36 mm×20 mm ($Al_2O_3$ ceramic (thickness 0.63 mm) and Cu metallization (thickness 0.3 mm) applied only to its upper side) is joined on its uncoated underside to a 0.5 mm thick aluminum sheet coated on one side with Al—Si. The copper metallization of the DCB substrates is structured for a circuit.

Figure 3:
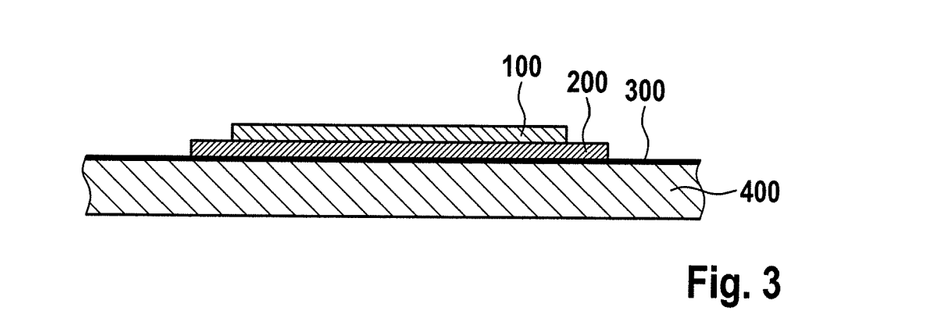
FIG. 3 illustrates a third example of a process for joining a metal ceramic substrate to a metal body.
Figure 4:
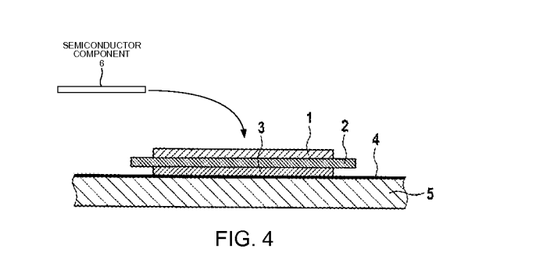
FIG. 4 illustrates an upper side of the DAB substrate 1,2,3 that is structured for a circuit 6, such as a semiconductor component.

For the joining process, the ceramic substrates to be joined are placed with the metallization facing upwards onto the Al—Si-coated side of the Al sheet. An in-principle sketch through the cross section of the structure is shown in FIG. 3, where the metallized ceramic substrate comprises metallization 100 and a ceramic 200 and the joining layer 300 is firmly joined to the aluminum sheet 400.

The join is produced between the ceramic of the substrate and the aluminum sheet (including intermediate layer). This stack is placed on the conveyor belt of a tunnel kiln having a plurality of heating zones and moved at a constant transport speed through the furnace and in the process heated to a temperature in the range from 580° C. to 650° C. and after passing through the heating zones cooled again to room temperature. The furnace process is carried out here under an $N_2$ atmosphere.

After the joining process, the substrate and the aluminum sheet are adhesively bonded to one another, with the peeling force for separating substrate and aluminum sheet being greater than 3 N/mm.

What is claimed is:

1. A method of joining a metal-ceramic substrate to a metal body using a metal alloy, where the metal-ceramic substrate has metallization on at least one side, the method comprising:
   providing the metal body with a thickness of less than 1 mm;
   placing a metal alloy which contains aluminum and has a liquidus temperature of greater than 450° C. between the metal-ceramic substrate and the metal body to form an assembly, wherein the metal-ceramic substrate is adapted to have a semiconductor component disposed on at least one metalized side of the metal-ceramic substrate, and wherein the metal-ceramic substrate includes a ceramic substrate and no more than two metal layers; and
   heating the assembly to a temperature of greater than 450° C. such that the at least one metalized side of the metal-ceramic substrate contacts an inert gas atmosphere during heating.

2. The method of claim 1, wherein the metal alloy further comprises silicon.

3. The method of claim 1, wherein the metal alloy further comprises magnesium.

4. The method of claim 1, wherein based on the total weight of the metal alloy, the metal alloy contains more than 50.0% by weight of aluminum.

5. The method of claim 1, wherein the metallization on the metal-ceramic substrate is on a side of the metal-ceramic substrate facing away from the metal body.

6. The method of claim 5, wherein the metallization comprises copper.

7. The method of claim 5, wherein the metallization comprises aluminum.

8. The method of claim 1, wherein the assembly is at least partly coated with at least one of nickel, gold, and silver.

9. The method of claim 1, wherein the metal body comprises aluminum.

10. The method of claim 1, wherein a ceramic portion of the metal-ceramic substrate comprises at least one of aluminum oxide, silicon nitride, and aluminum nitride.

11. The method of claim 1, wherein the metal body comprises at least one of AlSiC, MoCu, WCu, CuMoCu, and Cu/Invar/Cu.

12. The method of claim 1, wherein a side of the metal-ceramic substrate facing the metal body is smaller than a side of the metal body facing the metal-ceramic substrate.

13. A module comprising:
   (a) arranging a metal alloy between a metal-ceramic substrate and a metal body having a thickness of less than 1 mm, wherein an upper surface of the metal alloy contacts a lower surface of the metal-ceramic substrate, wherein a lower surface of the metal alloy contacts an upper surface of the metal body, wherein the metal alloy comprises aluminum, wherein the metal alloy has a liquidus temperature of at least 450° C., wherein the metal-ceramic substrate is adapted to have a semiconductor component disposed on at least one metalized side of the metal-ceramic substrate, and wherein the metal-ceramic substrate includes a ceramic substrate and no more than two metal layers; and
   (b) bounding the metal-ceramic substrate to the metal body such that a peel force for separating the metal-ceramic substrate from the metal body exceeds 3 N/mm, and such that the at least one metalized side of the metal-ceramic substrate contacts an inert gas atmosphere during bonding.

14. The method of claim 13, wherein the peel force exceeds 3 N/mm without using a screw, clamp, or Thermal Interface Material (TIM) to fasten the metal-ceramic substrate to the metal body.

15. The method of claim 13, wherein the bonding of (b) involves heating the metal-ceramic substrate, the metal alloy, and the metal body arranged in (a) to a temperature greater than 450° C.

16. The method of claim 13, wherein the metal body comprises aluminum.

17. The method of claim 13, wherein the metal alloy comprises aluminum, and wherein the metal alloy is 50.0% by weight aluminum.

18. The method of comprising:
   (a) placing an assembly onto a conveyor belt of a furnace having a plurality of heating zones, wherein the assembly comprises a substrate, a first metal layer, and a second metal layer having a thickness of less than 1 mm, wherein the substrate is disposed above the first metal layer such that a lower surface of the substrate contacts an upper surface of the first metal layer, wherein the first metal layer is disposed above the second metal layer such that a lower surface of the first metal layer contacts an upper surface of the second metal layer, wherein the first metal layer comprises aluminum and has a liquidus temperature of at least 450° C., wherein at least one metalized side of the substrate is adapted to receive a semiconductor component, and wherein the substrate includes a ceramic substrate and no more than two metal layers;

(b) heating the assembly through the plurality of heating zones of the furnace such that the at least one metalized side of the substrate contacts an inert gas atmosphere during heating, wherein the assembly is heated from between 580° C. to 650° C.; and (c) cooling the assembly to room temperature.

19. The method of claim 18, wherein the steps of (a), (b), and (c) cause the substrate to be bonded to the second metal layer such that a peel force for separating the substrate from the second metal layer exceeds 3 N/mm.

20. The method of claim 19, wherein the peel force exceeds 3 N/mm without using a screw, clamp, or Thermal Interface Material (TIM) to fasten the substrate to the second metal layer.

21. The method of claim 1, wherein the joining of the metal-ceramic substrate to the metal body results in a circuit carrier.

* * * * *

UNITED STATES PATENT AND TRADEMARK OFFICE
CERTIFICATE OF CORRECTION

PATENT NO. : 9,790,130 B2  
APPLICATION NO. : 13/482685  
DATED : October 17, 2017  
INVENTOR(S) : Heiko Knoll Page 1 of 1

It is certified that error appears in the above-identified patent and that said Letters Patent is hereby corrected as shown below:

In the Claims

Column 12, Line 46, the word "bounding" should be changed to --bonding--.

Signed and Sealed this  
Twenty-first Day of November, 2017

Joseph Matal  
*Performing the Functions and Duties of the*  
*Under Secretary of Commerce for Intellectual Property and*  
*Director of the United States Patent and Trademark Office*